United States Patent
Lin et al.

(10) Patent No.: US 7,237,338 B2
(45) Date of Patent: *Jul. 3, 2007

(54) METHOD FOR MANUFACTURING HEAT-DISSIPATING DEVICE WITH ISOTHERMAL PLATE ASSEMBLY OF PREDETERMINED SHAPE

(75) Inventors: Kuo-Len Lin, Wugu Township, Taipei County (TW); Hui-Min Tsui, Wugu Township, Taipei County (TW); Ken Hsu, Wugu Township, Taipei County (TW)

(73) Assignee: Cpumate Inc., Taipei (TW)

( * ) Notice: Subject to any disclaimer, the term of this patent is extended or adjusted under 35 U.S.C. 154(b) by 24 days.

This patent is subject to a terminal disclaimer.

(21) Appl. No.: 11/028,653

(22) Filed: Jan. 5, 2005

(65) Prior Publication Data

US 2006/0144561 A1   Jul. 6, 2006

(51) Int. Cl.
*B23P 6/00* (2006.01)
*F28F 7/00* (2006.01)
(52) U.S. Cl. ............... 29/890.032; 165/80.4
(58) Field of Classification Search .......... 29/890.032, 29/890.03, 890.038, 890.04, 890.041, 890.042, 29/890.043; 165/80.4, 171, 185
See application file for complete search history.

(56) References Cited

U.S. PATENT DOCUMENTS 2,014,703 A * 9/1935 Smith .................... 62/515
2,899,177 A * 8/1959 Harris et al. ............. 165/153
4,637,133 A * 1/1987 Freeman ................. 29/727
6,536,227 B1 * 3/2003 Lee ....................... 62/440
7,007,504 B2 * 3/2006 Kang ..................... 62/507
2003/0011990 A1   1/2003 Lai et al.

FOREIGN PATENT DOCUMENTS

JP     2001223308    8/2001
NL       9400082     9/1995

* cited by examiner

Primary Examiner—John C. Hong

(57) ABSTRACT

A heat-dissipating device with an isothermal plate assembly of predetermined shape and method for manufacturing the same are proposed. An upper plate and a lower plate with predetermined shape are provided and an accommodation groove is defined therein. A flattened heat pipe is bent into the predetermined shape and placed into the accommodation space. A binding agent is applied on the face between the heat pipe, the upper plate and the lower plate. A heat-dissipating unit composed of a plurality of heat-dissipating fins is assembled to a concave portion of the isothermal plate assembly of the predetermined shape. The upper plate and the lower plate are assembled with outer coupling unit and then a hot melting process is executed. The resultant product is then cooled to form a finished heat-dissipating device with an isothermal plate assembly of predetermined shape.

4 Claims, 6 Drawing Sheets

METHOD FOR MANUFACTURING HEAT-DISSIPATING DEVICE WITH ISOTHERMAL PLATE ASSEMBLY OF PREDETERMINED SHAPE

BACKGROUND OF THE INVENTION

1. Field of the Invention

The present invention relates to a heat-dissipating device with isothermal plate assembly of predetermined shape and method for manufacturing the same, and more particularly to a heat-dissipating device with isothermal plate assembly of predetermined shape and manufactured by low cost and high yield process.

2. Description of Prior Art

The conventional isothermal plate for heat-dissipating device of electronic apparatus is manufactured by a high thermally conductive material. The thermally conductive material is manufactured into a flat plate with a hollow accommodation space defined therein and containing wicked structure. The isothermal plate further comprises a wavy supporting unit arranged in the hollow accommodation space and used to support walls between an upper plate and a lower plate. The isothermal plate is then filled with working fluid and the accommodation space is sealed.

However, the isothermal plate described in above-mentioned process can only form plate-like structure because the conventional isothermal plate adopts non-vacuum structure. The conventional isothermal plate has crack problem when it is bent from flat state or its shape is varied due to temperature change. The yield of the conventional isothermal plate is degraded. Furthermore, due to the flat shape of the conventional isothermal plate, the electronic apparatus are arranged on one side of the isothermal plate, and the heat-dissipating fins are arranged on another side of the isothermal plate. The heat-dissipating device is difficult to be made compact and the heat-dissipating effect is influenced.

SUMMARY OF THE INVENTION

The present invention is to provide a heat-dissipating device with isothermal plate assembly of predetermined shape and manufactured by low cost and high yield process. The isothermal plate assembly is composed of an upper plate, a lower plate, and a heat pipe. The upper plate, the lower plate, and the heat pipe can be bent to a predetermined shape to assemble to the isothermal plate assembly with predetermined geometric shape. The heat-dissipating unit with corresponding shape is abutted to the isothermal plate assembly, thus forming the heat-dissipating device with isothermal plate assembly for various shapes.

Accordingly, the present invention provides a manufacturing method for a heat-dissipating device with isothermal plate assembly of predetermined shape. An upper plate and a lower plate with predetermined shape are provided and an accommodation groove is defined therein. A flattened heat pipe is bent into the predetermined shape and placed into the accommodation space. A binding agent is applied on the face between the heat pipe, the upper plate and the lower plate. A heat-dissipating unit composed of a plurality of heat-dissipating fins is assembled to a concave portion of the isothermal plate assembly of the predetermined shape. The upper plate and the lower plate are assembled with outer coupling unit and then a hot melting process is executed. The resultant product is then cooled to form a finished heat-dissipating device with an isothermal plate assembly of predetermined shape.

Moreover, the present invention provides a heat-dissipating device with isothermal plate assembly of predetermined shape. The heat-dissipating device comprises an isothermal plate assembly bent in a predetermined shape and composed of an upper plate and a lower plate, and an accommodation groove defined between the upper plate and the lower plate; at least one heat pipe being bent to the predetermined shape and placed into the accommodation groove; and a heat-dissipating unit composed of a plurality of heat-dissipating fins and assembled to the isothermal plate assembly of the predetermined shape.

The above summaries are intended to illustrate exemplary embodiments of the invention, which will be best understood in conjunction with the detailed description to follow, and are not intended to limit the scope of the appended claims.

BRIEF DESCRIPTION OF DRAWING

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

Figure 1:
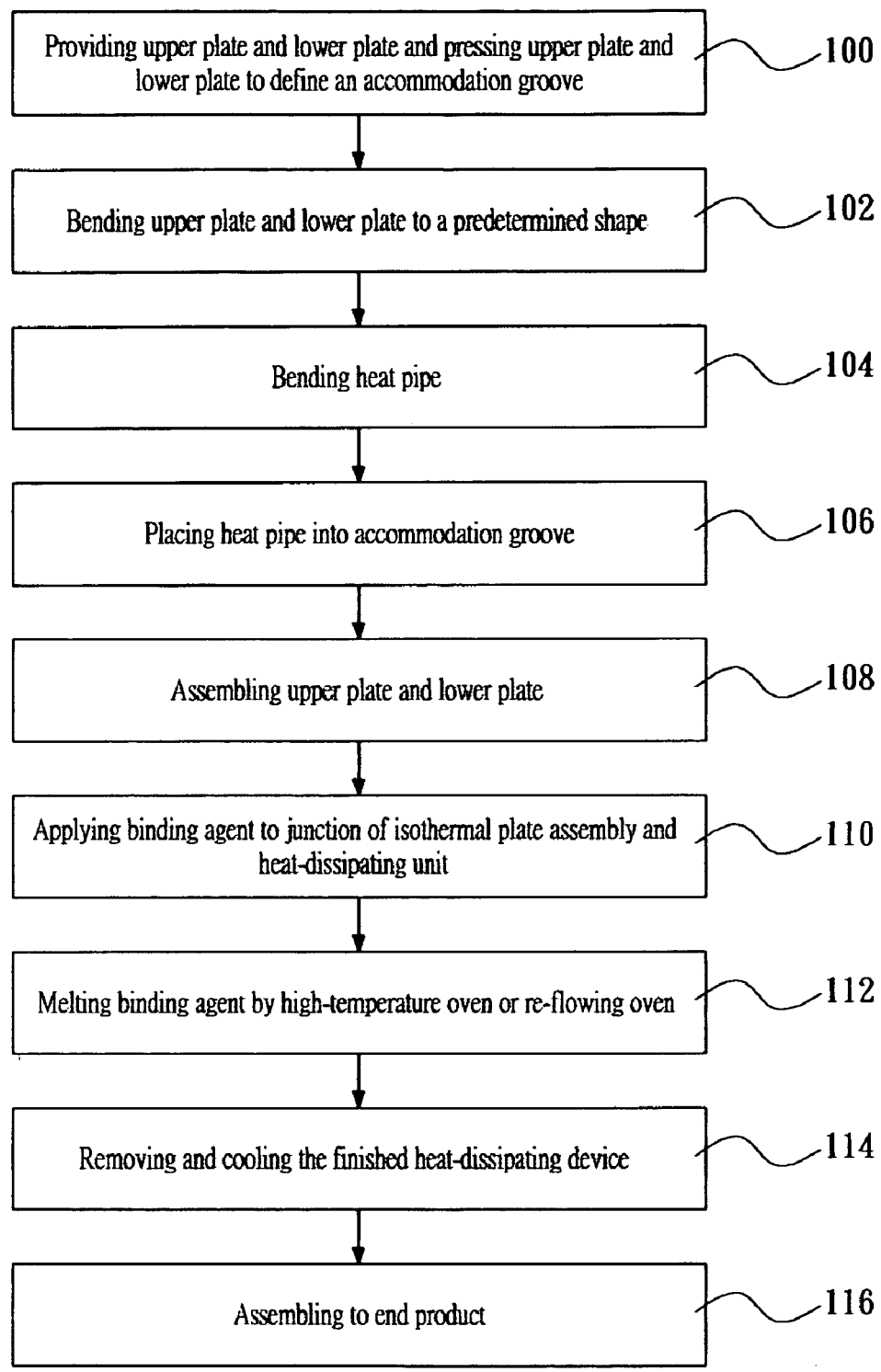
FIG. 1 is a flowchart of method for manufacturing the isothermal plate assembly according to a preferred embodiment of the present invention.
Figure 3:
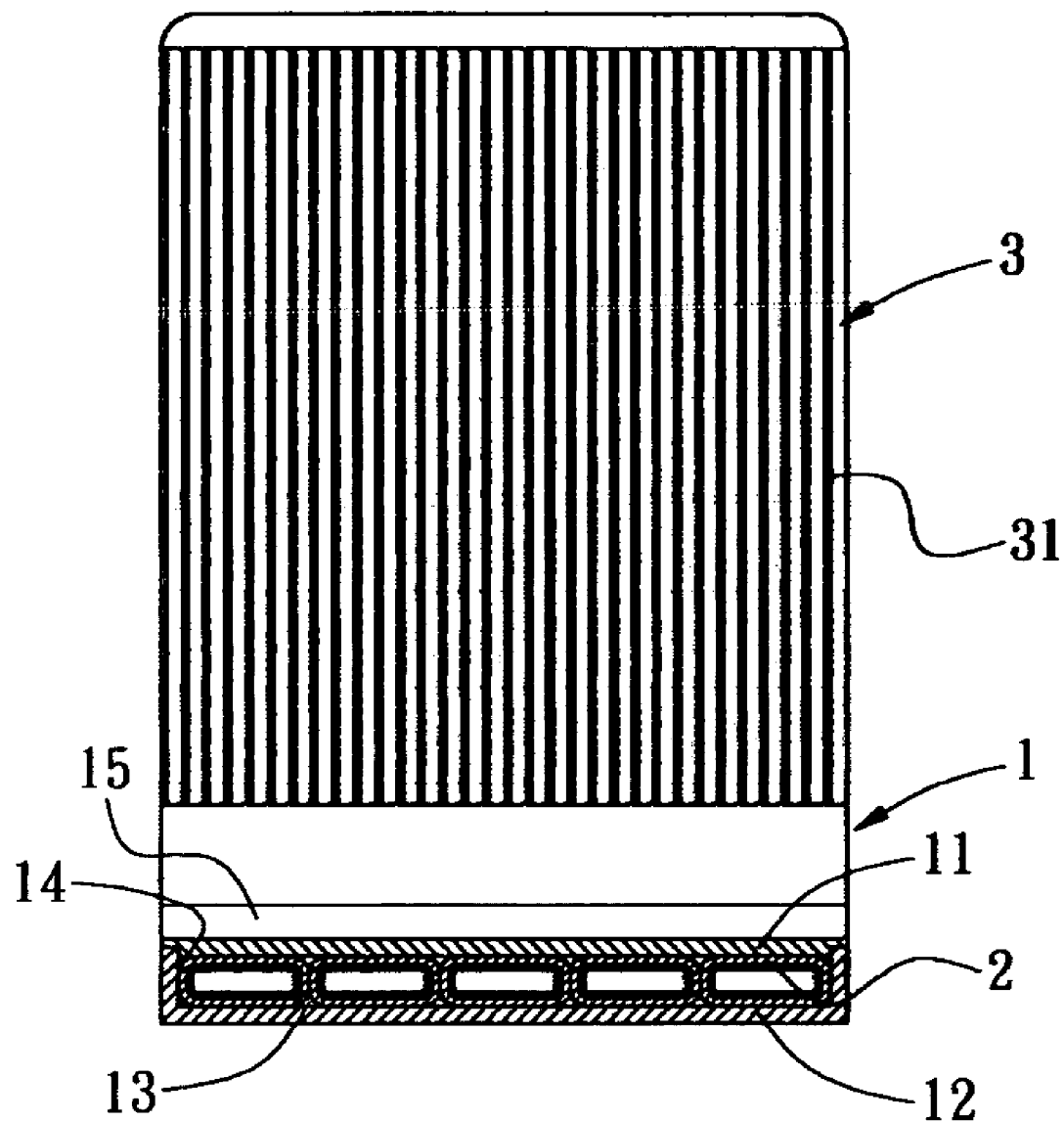
FIG. 3 is a sectional view of the isothermal plate assembly according to a preferred embodiment of the present invention.
Figure 4:
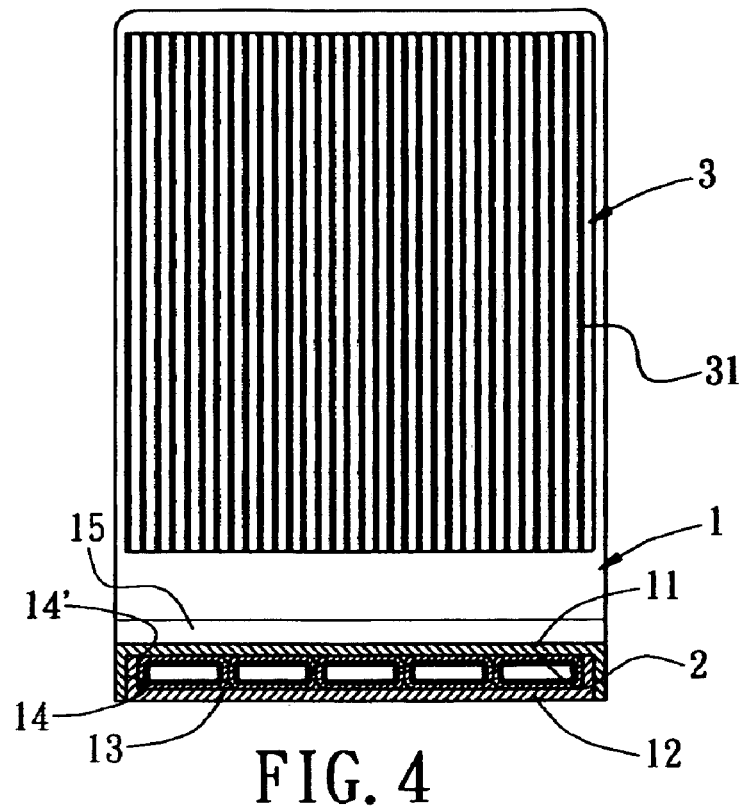
FIG. 4 is a sectional view of the isothermal plate assembly according to another preferred embodiment of the present invention.
Figure 5:
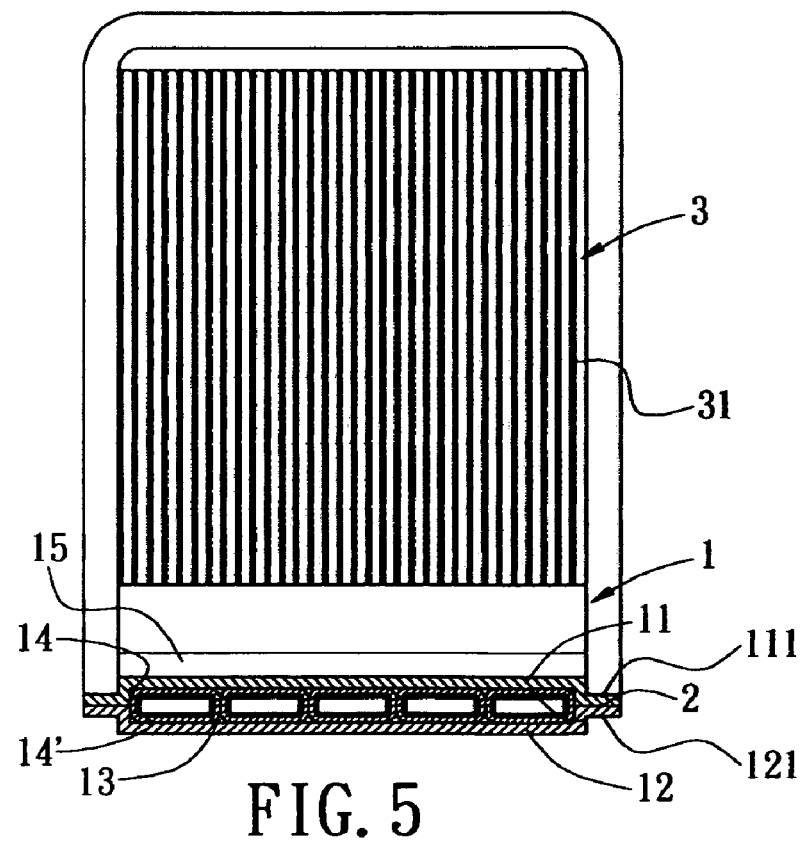
FIG. 5 is a sectional view of the isothermal plate assembly according to still another preferred embodiment of the present invention.

FIG. 1 shows the flowchart of method for manufacturing the heat-dissipating device with isothermal plate assembly of predetermined shape according to a preferred embodiment of the present invention, which comprises following steps:

Step 100: Providing an upper plate 11 and a lower plate 12, those plates being assembled to form an isothermal plate assembly 1, pressing on opposite faces of the upper plate 11 and the lower plate 12 to define an accommodation groove 13 as shown in FIGS. 3 to 5.

Step 102: Bending the upper plate 11 and the lower plate 12 to a predetermined shape such as L shape shown in FIG. 2, U shape shown in FIG. 6 or S shape shown in FIG. 7.

Figure 2:
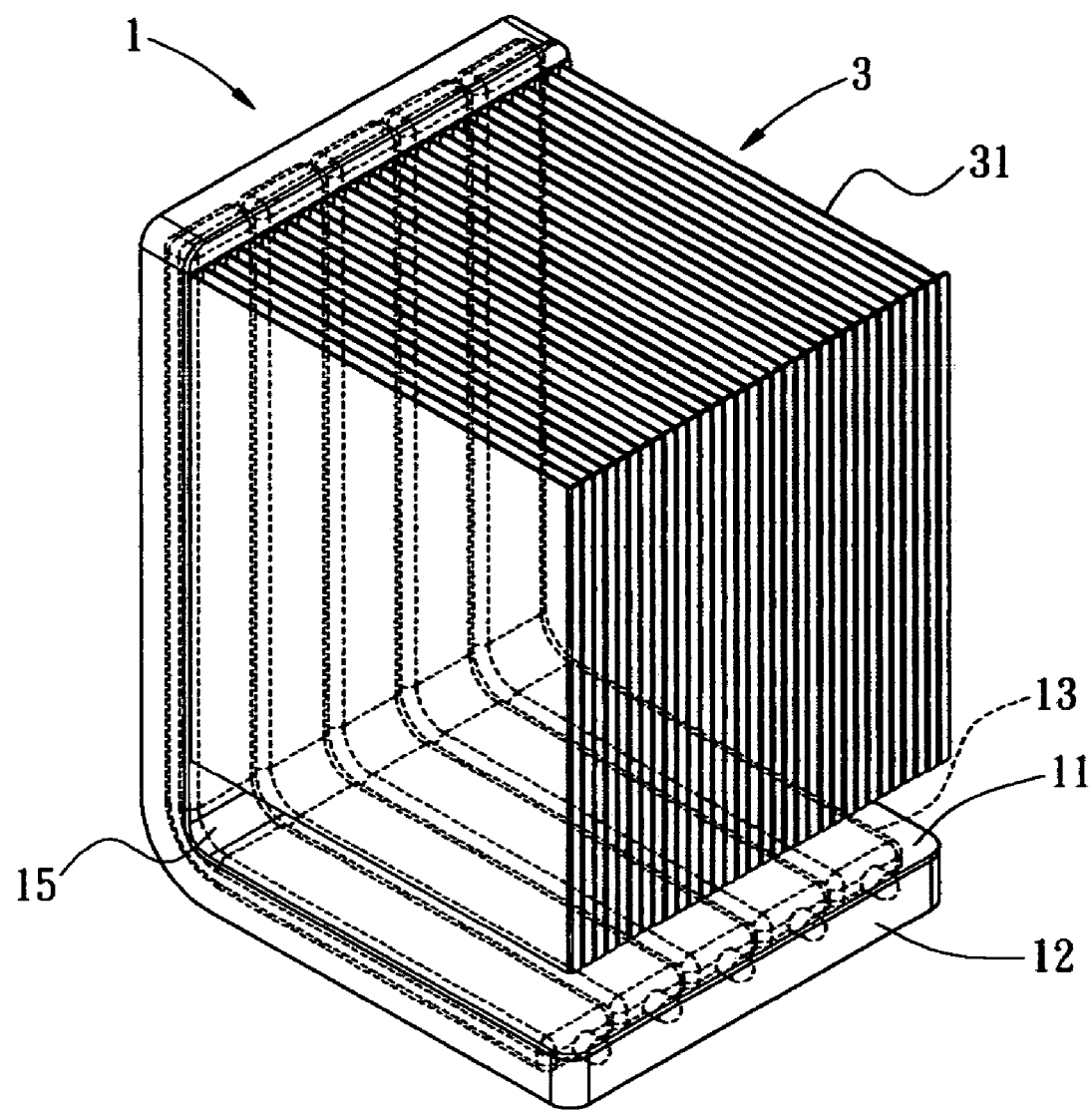
FIG. 2 is a perspective view of the isothermal plate assembly according to a preferred embodiment of the present invention.

Step 104: Providing at least one flattened flat heat pipe 2 and bending the heat pipe 2 with the shape corresponding to the upper plate 11 and the lower plate 12 as shown in FIG. 2.

Step 106: Placing the heat pipe 2 with bending shape formed in step 104 to the accommodation groove 13 formed in step 102 and applying binding agent to contact faces between the heat pipe 2 and the upper plate 11 and the lower plate 12. The binding agent is, for example, tin paste or 4450 glue, and could be hot-melted later to fill the gap between the heat pipe 2 and the upper plate 11 and the lower plate 12, and to assemble the heat pipe 2 and the upper plate 11 and the lower plate 12 together, as shown in FIG. 2.

Step 108: Assembling the upper plate 11 and the lower plate 12 together, wherein the heat pipe 2 in the accommodation groove 13 is also assembled together, as shown in FIGS. 2 and 4. To enhance the hermetic degree between the upper plate 11 and the lower plate 12, the binding agent is subjected to a following-up thermal-melting process. The upper plate 11 and the lower plate 12 can be assembled by one of riveting, snap locking, embedding, spot-welding, screwing, and glue-pasting step.

Step 110: Providing a heat-dissipating unit 3 composed with a plurality of heat-dissipating fins 31 and assembling the heat-dissipating unit 3 to a concave portion 15 on the isothermal plate assembly 1, applying a binding agent to junction of the heat-dissipating unit 3 and the concave portion 15, wherein the heat-dissipating unit 3 and the concave portion 15 can be kept in contacting state by using a clamper.

Step 112: Sending heat-dissipating unit 3 applied with the binding agent and the isothermal plate assembly 1 to a high-temperature oven or a re-flowing oven to melt the binding agent between the heat-dissipating unit 3 and the concave portion 15, thus producing a finished heat-dissipating device with isothermal plate assembly.

Step 114: Removing the finished heat-dissipating device formed in step 112 from oven and cooling the finished heat-dissipating device with isothermal plate assembly.

Figure 6:
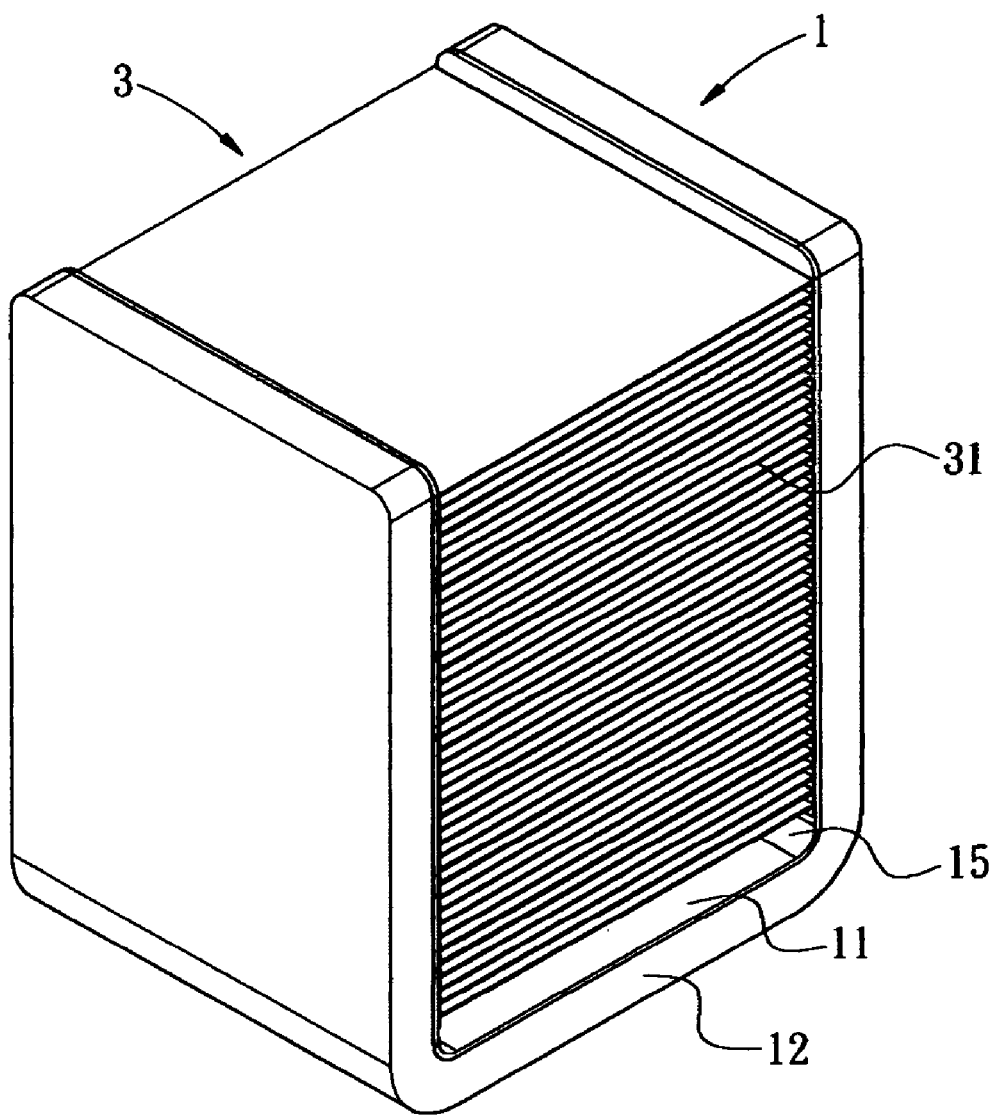
FIG. 6 is a perspective view of the isothermal plate assembly according to another preferred embodiment of the present invention.
Figure 7:
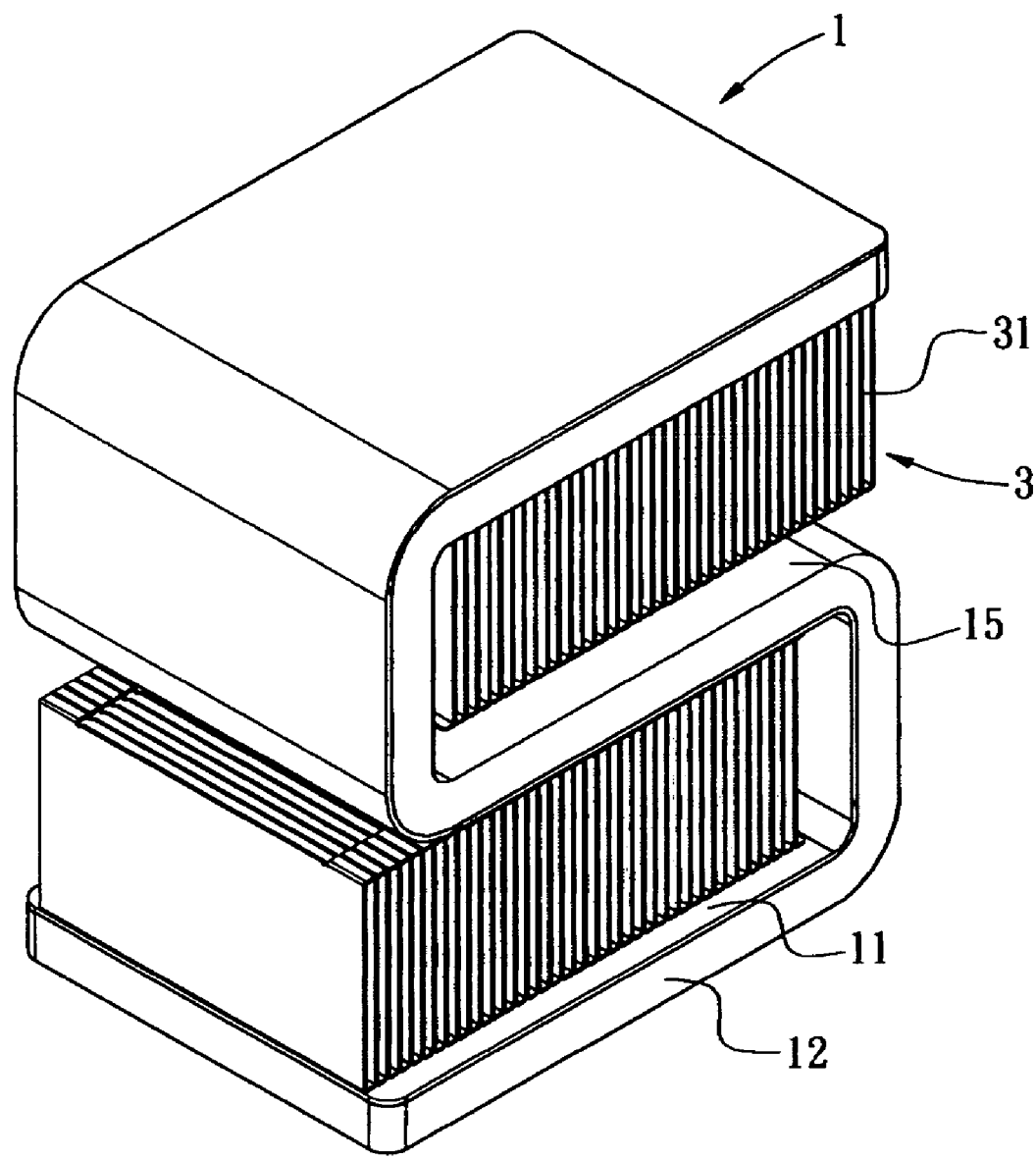
FIG. 7 is a perspective view of the isothermal plate assembly according to still another preferred embodiment of the present invention.

Step 116: The cooled and finished heat-dissipating devices are assembled to end product, as shown in FIGS. 2, 6, and 7.

In above step 104, the heat pipe 2 can be firstly subjected to flatten process and then bent according to the shape of the upper plate 11 and the lower plate 12.

In above-mentioned process, the isothermal plate assembly can be made with various shapes. The isothermal plate assembly is formed by assembling the upper plate 11 and the lower plate 12. The upper plate 11 and the lower plate 12 are preformed with predetermined bending shape. The heat pipe 2 also has corresponding bending shape and is placed between the upper plate 11 and the lower plate 12 for providing heat conduction. The isothermal plate assembly 1 with predetermined shape is further assembled with at least one heat-dissipating unit 3 having a plurality of heat-dissipating fins 31. The heat-dissipating unit 3 is attached to a concave portion of the isothermal plate assembly 1 by a hot melting process, Therefore, the heat-dissipating devices with isothermal plate assembly having multiple and various shapes can be made with simple and low cost process. The heat-dissipating devices with isothermal plate assembly can be easily adapted with various electronic devices.

The above-mentioned steps 102, 104 and 106 are interchangeable. That is, the heat pipe 2, the upper plate 11 and the lower plate 12 are bent before the heat pipe 2 is placed into the accommodation groove 13 formed between the upper plate 11 and the lower plate 12. Alternatively, the heat pipe 2 is firstly placed into the accommodation groove 13 formed between the upper plate 11 and the lower plate 12 and then bent together with the upper plate 11 and the lower plate 12. Moreover, a binding agent is selectively applied to contact faces between the heat pipe 2 and the upper plate 11 (and the lower plate 12). The binding agent fills the gap between the heat pipe 2 and the upper plate 11 (and the lower plate 12) by a following-up heating process.

In above-mentioned step 106, the step of applying binding agent to contact faces between the heat pipe 2 and the upper plate 11 (and the lower plate 12) can be eliminated if the hermetic degree between the heat pipe 2 and the upper plate 11 (and the lower plate 12) is sufficient. The step of applying binding agent to contact faces between the upper plate 11 and the lower plate 12 can also be eliminated in step 108. The thus-formed isothermal plate assembly 1 is further assembled with heat-dissipating unit 3 and then subjected to hot-melting and cooling process to form the heat-dissipating device with isothermal plate assembly 1 of various shapes.

The heat-dissipating device with isothermal plate assembly 1 of various shapes can be manufactured by above-mentioned method. The detailed structure of the heat-dissipating device with isothermal plate assembly will be described with reference to FIGS. 2 to 7. Those figures show the heat-dissipating device with isothermal plate assembly for various embodiments.

The embodiments in FIGS. 2 to 5 discloses heat-dissipating device with isothermal plate assembly for various shapes. The heat-dissipating device comprises an isothermal plate assembly 1 of various shapes, a bent flattened heat pipe 2 received in the isothermal plate assembly 1, and heat-dissipating unit 3 with shape corresponding to the isothermal plate assembly 1, as shown in FIG. 2.

The isothermal plate assembly 1 with one of various shapes is composed of an upper plate 11 and a lower plate 12. The isothermal plate assembly 1 can be formed by assembling an upper plate 11 and a lower plate 12 with predetermined geometric shape. The shape is, for example, L shape in FIG. 2, U shape in FIG. 6 or S shape in FIG. 7. Moreover, the isothermal plate assembly 1 comprises at least one concave portion 15 for assembling the heat-dissipating unit 3.

The upper plate 11 and the lower plate 12 are used form a closed isothermal plate assembly 1 and define an accommodation groove 13 therein for receiving the flattened heat pipe 2. In one preferred embodiment, at least one dent 14 is defined on either the upper plate 11 or the lower plate 12. The upper plate 11 or the lower plate 12 with the dent 14 is assembled with the lower plate 12 or the upper plate 11 with smooth face to form an isothermal plate assembly 1 with the accommodation groove 13, as shown in FIG. 3.

According to other preferred embodiment, both the upper plate 11 and the lower plate 12 are provided with dents 14, 14' to define the accommodation groove 13 when the upper plate 11 and the lower plate 12 are assembled together, as shown in FIG. 4. Moreover, as shown in FIG. 5, the upper plate 11 and the lower plate 12 provided with dent 14, 14' are assembled by the help of outer coupling plates 111 and 121. The accommodation groove 13 is defined by the dents provided by the upper plate 11 and the lower plate 12.

The heat pipe 2 is placed in the accommodation groove 13 defined by the dents provided by the upper plate 11 and the lower plate 12 and is functioned to provide heat conduction. The heat pipe 2 is flattened to increase a contact surface between the upper plate 11 and the lower plate 12 and can be bent according to the shape of the upper plate 11 and the lower plate 12. Therefore, the heat pipe 2 has shape corresponding to the shape of the accommodation groove 13 between the upper plate 11 and the lower plate 12. The heat pipe 2 can be easily assembled into the accommodation groove 13, as shown in FIGS. 2 to 5.

The heat-dissipating unit 3 is composed of a plurality of heat-dissipating fins 31 and assembled to the concave portion 15 of the isothermal plate assembly 1 of various shapes. Therefore, the heat-dissipating unit 3 is abutted to the concave portion 15 of the isothermal plate assembly 1 and can be assembled to the isothermal plate assembly 1 by melting the binding agent.

To sum up, the isothermal plate assembly 1 is composed of the upper plate 11, the lower plate 12, and the heat pipe 2. The upper plate 11, the lower plate 12, and the heat pipe 2 can be bent to predetermined shape to assemble to the isothermal plate assembly 1 with predetermined geometric shape. The heat-dissipating unit 3 with corresponding shape is abutted to the concave portion 15 of the isothermal plate assembly 1, thus forming the heat-dissipating device with isothermal plate assembly for various shapes, and suitable for various electronic devices and chassis.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

What is claimed is:

1. A method for manufacturing heat-dissipating device with isothermal plate
   assembly of a predetermined shape, the heat-dissipating device comprising an isothermal plate assembly having an upper plate and a lower plate with the predetermined shape, and a bending heat pipe placed therein, the heat-dissipating device further comprising a heat-dissipating unit with the predetermined shape, the method comprising the steps of:
   a. providing the shape upper plate and the lower plate with an accommodation groove defined therein;
   b. bending the upper plate and the lower plate to the predetermined shape first; then providing a flattened heat pipe and bending the flattened heat pipe to the predetermined shape;
   c. placing the bending heat pipe into the accommodation groove and assembling the upper plate and the lower plate to form the isothermal plate assembly with a concave portion;
   d. preparing the heat-dissipating unit and assembling the heat-dissipating unit to the isothermal plate assembly, applying a binding agent to a junction between the heat-dissipating unit and the isothermal plate assembly;
   e. sending the heat-dissipating unit and the isothermal plate assembly to an oven for melting the binding agent and forming a heat dissipating device with the isothermal plate assembly;
   f. removing and cooling the heat dissipating device; and
   g. finishing the manufacture of the heat-dissipating device.

2. The method as in claim 1, wherein the predetermined shape includes one of L shape, U shape, and S shape.

3. The method as in claim 1, further comprising the step of:
   applying a binding agent on a contact face between the heat pipe and the upper plate and the lower plate, and another contact face between the upper plate and the lower plate, the binding agent being melted in the hot-melting process to seal a gap between the heat pipe and the upper plate and the lower plate.

4. The method as in claim 1, further comprising the step of
   using outer coupling plates to clamp the upper plate and the lower plate together after the binding agent is applied;
   after assembling the upper plate and the lower plate, sending the assembled upper plate and lower plate to one of high temperature oven and re-flowing oven for a hot melting process; and
   cooling the assembled upper plate and lower plate.

* * * * *